(12) United States Patent
Burenkov (10) Patent No.: US 8,023,891 B2
(45) Date of Patent: Sep. 20, 2011

(54) INTERCONNECTION NETWORK BETWEEN SEMICONDUCTOR STRUCTURES, INTEGRATED CIRCUIT AND METHOD FOR TRANSMITTING SIGNALS

(75) Inventor: Alexander Burenkov, Erlangen (DE)

(73) Assignee: Fraunhofer-Gesellschaft zur Forderung der angewandten Forschung e.V., Munich (DE)

( * ) Notice: Subject to any disclaimer, the term of this patent is extended or adjusted under 35 U.S.C. 154(b) by 942 days.

(21) Appl. No.: 11/961,617

(22) Filed: Dec. 20, 2007

(65) Prior Publication Data

US 2008/0212975 A1    Sep. 4, 2008

(30) Foreign Application Priority Data

Dec. 27, 2006   (DE) .................. 10 2006 061 586

(51) Int. Cl.
*H04B 5/00*    (2006.01)
(52) U.S. Cl. ......... 455/41.1; 327/570; 327/195; 257/25; 257/30; 257/401
(58) Field of Classification Search ............ 455/41.1; 327/570, 571, 195, 196; 257/14, 24, 25, 257/26, 27, 28, 29, 30, 37–39, 288, 401
See application file for complete search history.

(56) References Cited

U.S. PATENT DOCUMENTS

| | | | | |
|---|---|---|---|---|
| 4,706,251 A | | 11/1987 | Rona ................. 372/4 |
| 4,762,382 A | | 8/1988 | Husain et al. ............ 350/96.12 |
| 5,056,111 A | * | 10/1991 | Duling et al. ............ 375/259 |
| 5,093,692 A | * | 3/1992 | Su et al. ................. 257/104 |
| 5,754,948 A | * | 5/1998 | Metze ..................... 455/41.2 |
| 5,825,240 A | * | 10/1998 | Geis et al. ............... 327/570 |
| 6,178,275 B1 | | 1/2001 | Nerses et al. ............. 385/14 |
| 6,967,347 B2 | * | 11/2005 | Estes et al. .............. 257/25 |
| 7,010,183 B2 | | 3/2006 | Estes et al. .............. 385/14 |
| 7,105,852 B2 | * | 9/2006 | Moddel et al. ........... 257/30 |
| 7,126,151 B2 | * | 10/2006 | Estes et al. .............. 257/25 |
| 7,184,641 B2 | | 2/2007 | Karalis et al. ............ 385/129 |
| 7,778,621 B2 | * | 8/2010 | Tandy ..................... 455/333 |
| 2003/0179974 A1 | | 9/2003 | Estes et al. .............. 385/2 |
| 2004/0069984 A1 | | 4/2004 | Estes et al. .............. 257/25 |
| 2004/0165669 A1 | | 8/2004 | Otsuka et al. ............ 375/257 |

(Continued)

FOREIGN PATENT DOCUMENTS

DE        19841736        4/2000

(Continued)

OTHER PUBLICATIONS

Michael S. Shur and Jian-Quang Lü, Terahertz Sources and Detectors Using Two-Dimensional Electronic Fluid in High Electron-Mobility Transistors, IEEE Transactions on Microwave Theory and Techniques, vol. 48, No. 4, Apr. 2000.

(Continued)

*Primary Examiner* — Tuan A Tran
(74) *Attorney, Agent, or Firm* — Brinks Hofer Gilson & Lione (57) ABSTRACT

The invention relates to an interconnection network and an integrated circuit and a method for manufacturing the same. Furthermore, the invention relates to a method for signal transfer between semiconductor structures. The invention is characterized in that a signal of a first semiconductor structure is supplied to a transmitter, which generates from the signal a plasmon wave, and couples the latter into a waveguide. The plasmons fed through the waveguide are received by a receiver, converted to an electric signal and forwarded to a second semiconductor structure.

42 Claims, 4 Drawing Sheets

U.S. PATENT DOCUMENTS

| | | | |
|---|---|---|---|
| 2004/0201076 A1 | 10/2004 | Shur et al. | 257/462 |
| 2005/0104684 A1 | 5/2005 | Wojcik et al. | 333/108 |
| 2005/0249451 A1 | 11/2005 | Baehr-Jones et al. | 385/14 |
| 2005/0259936 A1 | 11/2005 | Karalis et al. | 385/129 |

FOREIGN PATENT DOCUMENTS

| | | |
|---|---|---|
| EP | 0 297 483 A2 | 1/1989 |
| JP | 2006023410 | 1/2006 |
| WO | WO 98/49587 | 11/1998 |

OTHER PUBLICATIONS

International, Technology Roadmap for Semiconductors, 2005.

J.-C. Weber, J.R. Krenn, A. Dereux, B. Lamprecht, Y. Lacroute and J.P. Goudonnet, Near-field Observation of Surface Plasmon Polariton Propagation on Thin Metal Stripes, Physical Review B, vol. 64, The American Physical Society, Jul. 2, 2001.

Michael S. Shur and Victor Ryzhii, Plasma Wave Electronics, International Journal of High Speed Electronics and Systems, vol. 13, Jun. 2003, pp. 575-600, Singapore.

W. Knap, J. Lusakowski, T. Parenty, S. Bollaert, A. Cappy, V.V. Popov and M.S. Shur, Terahertz Emission by Plasma Waves in 60 nm Gate High Electron Mobility Transistors, American Institute of Physics, vol. 84, No. 13, Mar. 29, 2004.

W. Knap, F. Teppe, Y. Meziani, N. Dyakonova, J. Lusakowski, F. Boeuf, T. Skotnicki, D. Maude, S. Rumyantsev and M.S. Shur, Plasma Wave Detection of Sub-terahertz and Terahertz Radiation by Silicon Field-effect Transistors, American Institute of Physics, vol. 85, No. 4, Jul. 26, 2004.

Thomas Nikolajsen, Kristin Leosson, Ildar Salakhutdinov and Sergey I. Bozhevolnyi, Polymer-based Surface-Plasmon-Polariton Stripe Waveguides at Telecommunication Wavelengths, American Institute of Physics, vol. 82, No. 5, Feb. 3, 2003.

* cited by examiner

INTERCONNECTION NETWORK BETWEEN SEMICONDUCTOR STRUCTURES, INTEGRATED CIRCUIT AND METHOD FOR TRANSMITTING SIGNALS

BACKGROUND OF THE INVENTION

The invention relates to an interconnection network between semiconductor structures, comprising a waveguide for the transfer of a signal between the semiconductor structures, a transmitter to receive the signal of a first semiconductor structure and to couple the signal into the waveguide, and a receiver to receive the signal from the waveguide and forward it to a second semiconductor structure. Such interconnection networks are used on integrated circuits in order to transfer any of a data signal, a command signals or a clock signal between different semiconductor structures. These semiconductor structures can, as an example, comprise storage cells or computing structures.

A conventional interconnection network between different semiconductor structures on integrated circuits is manufactured by use of resistive conductors. For this purpose an appropriate sub-region of the surface of the semiconductor is metalized with aluminum, gold or copper. Electric signals can be coupled to one end of said metalized areas and are received at the other end. However what is disadvantageous here is that such an interconnect has an electric capacity and a resistance, which must be recharged each time a signal is transmitted. Since the current available for recharging this capacity is limited by the electrical resistance of the circuitry, signal delays arise in the integrated circuit. On an integrated circuit featuring a structure size of 65 nm, this delay is a factor of 5 larger than the gate delays of the arithmetic unit or the storage device.

In order to reduce these delays it is known to introduce additional transistors as signal repeaters and amplifiers. For this purpose however additional circuit elements are required on the integrated circuit, which increase the susceptibility to defects, the current consumption and the manufacturing costs of the integrated circuit.

It is known to introduce optical interconnections between semiconductor structures to solve this problem. In this case the signal processing is possible at the velocity of light and thus independently of charge carrier drift velocities and capacitances. However the level of effort required is several times greater. The electrical signals generated on the semiconductor structures must be converted into optical signals first. For this purpose special opto-electronic circuit elements are required, which by reason of the indirect band gap of a silicon die cannot be manufactured in silicon technology of known art. At the endpoint of the optical waveguide this optical signal must then be converted with the same level of effort back into an electrical signal. Furthermore, efficient optical elements require geometrical dimensions of the same order as the wavelength of the light used. However, CMOS structures commercially used at the present time already have structure sizes of 90 nm or less. No semiconductor elements are available as transmitter diodes for radiation at a 90 nm wavelength.

The object of the invention is therefore to transfer the electrical signals of a first semiconductor structure to a second semiconductor structure without having to undertake a conversion of the electrical signal into an optical signal and without the delay induced by the capacity and the resistance of a conventional interconnecting network.

SUMMARY OF THE INVENTION

One embodiment of the present invention relates to an interconnection network between a first semiconductor structure and a second semiconductor structure, comprising a transmitter for transmitting a signal originating from said first semiconductor structure, said transmitter being electrically connected to said first semiconductor structure. The transmitter is adapted to convert said electric signal directly to a modulated plasmon wave and to couple it to a waveguide extending from said first semiconductor structure to said second semiconductor structure. The waveguide ends at a receiver cooperating with said waveguide to receive said modulated plasmon wave and being adapted to convert it to a modulated electric signal, said receiver being electrically connected to said second semiconductor structure.

Another embodiment of the present invention relates to an interconnection network between a first semiconductor structure and a second semiconductor structure, comprising at least one MOSFET for transmitting a signal originating from said first semiconductor structure, said MOSFET comprising a source electrode and a drain electrode adjacent to a channel region which is delimited by an electrically insulated gate electrode, said MOSFET being electrically connected to said first semiconductor structure and wherein said MOSFET is adapted to generate a modulated plasmon wave in said channel region. At least one waveguide extends from said first semiconductor structure to said second semiconductor structure and a fist end of said waveguide cooperates with said MOSFET to receive said modulated plasmon wave. The waveguide comprises at least any of a boundary layer between a metal layer and a semiconductor, or a boundary layer between a metal layer and an insulator. Furthermore, the embodiment of the invention comprises at least one MOSFET for receiving a signal originating from said waveguide. The MOSFET comprises a source electrode and a drain electrode adjacent to a channel region which is delimited by an electrically insulated gate electrode, said MOSFET being electrically connected to the second semiconductor structure. The MOSFET cooperates with said a second end of the waveguide to receive a modulated plasmon wave in said channel region and is adapted to convert it to a modulated electric signal.

In still another embodiment, the present invention relates to an integrated circuit, comprising a first semiconductor structure and a second semiconductor structure. Furthermore, the integrated circuit comprises a transmitter for transmitting a signal originating from said first semiconductor structure, being electrically connected to the first semiconductor structure and being adapted to convert said signal directly to a modulated plasmon wave. A waveguide extending from said first semiconductor structure to said second semiconductor structure is provided which cooperates with said transmitter to receive said modulated plasmon wave. The waveguide comprises at least any of a boundary layer between a metal layer and a semiconductor, or a boundary layer between a metal layer and an insulator. A receiver cooperates with said waveguide to receive said modulated plasmon wave and is adapted to convert it to a modulated electric signal. The receiver is electrically connected to the second semiconductor structure.

Another embodiment of the present invention relates to a method for signal transfer between a first semiconductor structure and a second semiconductor structure. The method comprises the following steps:

Generate an electric signal by use of said first semiconductor structure,

Transmit said electric signal to a transmitter for transmitting said signal,

Convert said electric signal to a modulated plasmon wave by use of said transmitter, Couple said modulated plasmon wave to a first end of a waveguide cooperating with said transmitter, Couple said modulated plasmon wave from a second end of said waveguide to a receiver cooperating with said waveguide, Convert said modulated plasmon wave to an electric signal by use of said receiver, Transmit said electric signal to said second semiconductor structure.

Still another embodiment of the present invention relates to a method of manufacturing an integrated circuit, wherein a semiconductor substrate is provided and a first and a second semiconductor structure is manufactured on this substrate. In the next step, a transmitter for transmitting a signal originating from said first semiconductor structure, being electrically connected to said first semiconductor structure and being adapted to convert said signal to a modulated plasmon wave is provided. It may form a part of the first semiconductor structure. A waveguide extending from said first semiconductor structure to said second semiconductor structure and cooperating with said transmitter to receive said modulated plasmon wave is build. The waveguide comprises at least any of a boundary layer between a metal layer and a semiconductor, or a boundary layer between a metal layer and an insulator. Another step of the method is providing a receiver cooperating with said waveguide to receive said modulated plasmon wave and being adapted to convert it to a modulated electric signal. The receiver is electrically connected to said second semiconductor structure. It may be a part of this second semiconductor structure

BRIEF DESCRIPTION OF THE DRAWINGS

The above recited features of the present invention will become clear from the following description, taken in conjunction with the accompanying drawings. It has to be noted that the accompanying drawings illustrate only typical embodiments of the present invention and are, therefore, not to be considered limiting to the scope of the invention. The present invention may admit other equally effective embodiments.

DETAILED DESCRIPTION OF THE DRAWINGS

Figure 1:
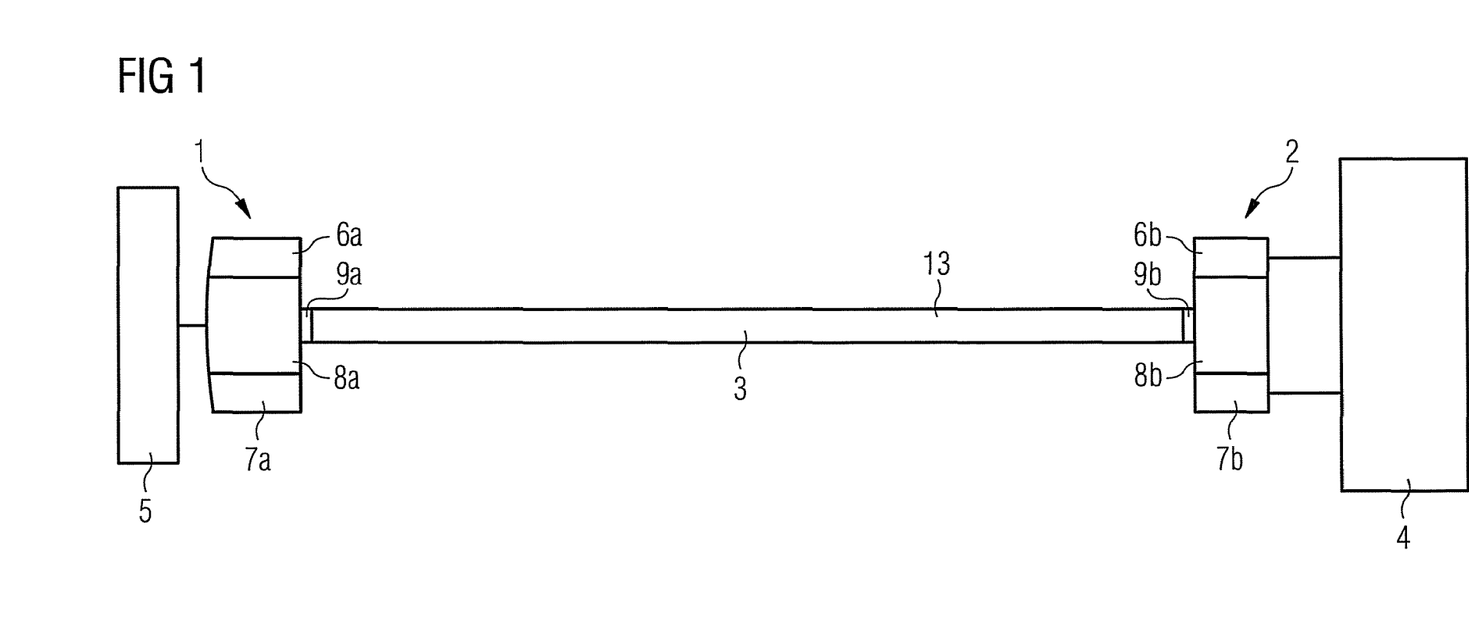
FIG. 1 shows schematically a topography of an integrated circuit with a receiver and a transmitter.

FIG. 1 shows a schematic topography of an integrated circuit comprising a receiver and a transmitter. The integrated circuit comprises a first semiconductor structure 5 and a second semiconductor structure 4. Close to the first semiconductor structure 5, a transmitter 1 is located. Close to the second semiconductor structure 4, a receiver 2 is located. Transmitter 1 and receiver 2 are connected to each other by a waveguide 3. Furthermore, receiver 2 is connected by a conventional ohmic interconnect to the second semiconductor structure 4. Transmitter 1 is connected by a conventional ohmic interconnect to the first semiconductor structure 5. All mentioned parts are located on a single semiconductor die 10. The semiconductor die 10 may be made from silicon, germanium, gallium-arsenide, indium-antimonide or the like. It may comprise a dopant.

As an example, transmitter 1 may comprise a single MOSFET to convert the electric signal generated by the first semiconductor structure 5 to a modulated plasmon wave and couple this plasmon wave into the waveguide 3. The MOSFET comprises a source electrode 6a and a drain electrode 7a adjacent to a channel region 11a which is delimited by an electrically insulated gate electrode 8a. As the gate electrode 8a covers the channel region 11a, it is not visible in FIG. 1. The gate electrode 8a is connected to the first semiconductor structure and receives a modulated electric signal. As the voltage at gate electrode 8a is modulated, the plasmon wave exited at the channel region is also modulated. The source electrode 6a and the drain electrode 7a are connected to respective supply voltages. One supply voltage may be constituted by the ground potential. The means for providing the supply voltages are not shown in FIG. 1. The source electrode 6a and the drain electrode 7a each are build from doped regions on the semiconductor substrate 10 comprising the integrated circuit.

As an example, receiver 2 may comprise a single MOSFET to convert the plasmon wave received from waveguide 3 to an electric signal to be received by the first semiconductor structure 4. The MOSFET comprises a source electrode 6b and a drain electrode 7b adjacent to a channel region 11b which is delimited by an electrically insulated gate electrode 8b. As the gate electrode 8b covers the channel region 11b, it is not visible in FIG. 1. The source electrode 6a and the drain electrode 7a each are build from doped regions on the semiconductor substrate 10 comprising the integrated circuit. The gate electrode 8b is connected to a supply voltage. A supply voltage may be constituted by the ground potential. The means for providing the supply voltage are not shown in FIG. 1. The source electrode 6a and the drain electrode 7a are connected to the second semiconductor structure. The plasmon wave received from the waveguide 3 is rectified in the channel region 11 thereby generating a voltage signal between the source electrode 6b and the drain electrode 7b.

In another embodiment of the invention not shown in FIG. 1, the transmitter 1 and/or the receiver 2 may comprise a diode. The diode may comprise a n-doped area and a p-doped area. As an alternative, the diode may comprise a boundary layer between a semiconductor and a metal layer. By connecting the diode to a supply voltage and feeding a modulated electric signal, the diode may be used as an emitter or receiver of a modulated plasmon wave. Tunneling diode structures are known as generators of plasmon excitations.

Diodes can also serve as efficient detectors of surface plasmons. The use of an organic diode is known as integrated surface plasmon detector. An efficient detection of photons by resonant tunneling diodes has been shown.

In another embodiment of the invention not shown in FIG. 1, any other electrically driven device emitting plasmon waves may be used as a transmitter 1. Any other device converting a plasmon wave into an electric signal may be used as a receiver 2. It has to be noted, that the receiver 2 and the transmitter 1 must not be of the same type. Receivers and transmitters used according the invention are able to convert a plasmon wave directly into an electrical signal without the need to convert it in an optical signal, e.g. infrared or visual light, first.

In the embodiment of the invention shown in FIG. 1, a single MOSFET is sufficient as a plasmon emitter 1 or receiver 2. In other embodiments of the invention, the plasmons of a plurality of MOSFET are added into one waveguide 3 to increase the signal to noise ratio. On occasion a person skilled in the art can also provide other transistors in order to condition the electrical signal and to allow for electrical impedance matching to the transmitting MOSFET 1.

The surface plasmons, which are used for signal transfer in the waveguide 3, are an oscillation of free electrons, which propagate along the surface of a metal 13, or along a boundary layer between a metal 13 and a semiconductor 10, or in a two-dimensional electron gas of a semiconductor 10, or at a boundary layer between a metal 13 and an insulator 14. Therefore, the waveguide according to the invention is constructed such that at least one of the cited conditions for plasmon propagation is satisfied. It has to be noted that no macroscopic electronic charge is transported along the waveguide 3 as the wave propagates along the waveguide 3.

In order to generate a plasmon wave in the channel region of a MOSFET, a ballistic transport of the charge carriers between source 6a and drain 7a must be induced. A voltage is applied to drain electrode 7a and gate electrode 8a of the transmitting MOSFET 1 such that a charge carrier inversion layer forms in the channel region between source 6a and drain 7a. This leads to a ballistic transport of charge carriers between source 6a and drain 7a. This ballistic transport is characterized in that electrons or holes migrate from source to drain without being significantly scattered at impurity atoms or phonons. The electrons propagate in the channel region 11a with a randomly oriented thermal velocity distribution. The MOSFET 1 now emits surface plasmons from its channel region 11a. The velocity S of the plasmon waves is proportional to the square root of the electron density, and can therefore be simply influenced by the gate voltage. The channel region 11a of the field effect transistor serves as a resonance cavity for the plasmon waves.

According to the invention the surface plasmons, which are generated in the channel region of a MOSFET by the ballistic transport of the charge carriers between source 6 and drain 7, can be directly coupled into a plasmon waveguide. A MOSFET is only an exemplary embodiment for this principle. Any other device generating plasmon waves can be used to couple this wave into the waveguide by direct electromagnetic coupling. Thus in accordance with the present invention a MOSFET or the like can be used as a transmitter device, or line driver, for a plasmon waveguide.

To allow the plasmon wave to propagate alongside the waveguide, a condition for plasmon propagation must be met.

In one embodiment of the invention, the waveguide delimits a two-dimensional electron gas. To achieve a two-dimensional electron gas, the waveguide comprises a MIS-structure, i.e. an insulator 14 and a metal layer 13 on a semiconductor surface 10. The insulator 14 may comprise an oxide or a nitride compound. If the semiconductor is made from silicon, the insulator may be made of $SiO_x$ and/or SiN.

A positive supply voltage is applied to the metal layer 13 to lower the potential energy of the electrons at the boundary layer between the n-doped semiconductor and the insulator. If a p-doped semiconductor is used, the supply voltage has to be negative. The amplitude of the voltage is chosen so that the conduction band lowers under the Fermi energy. A triangular-shaped quantum-well develops which restricts the movement of the electrons in the plane of the waveguide. The so-called charge carrier inversion layer bounds a two-dimensional electron gas in which the plasmon wave propagates in a geometrically localized manner.

In the context of this invention the metal layer 13 may also comprise an alloy. The metal layer preferably contains gold, copper or aluminum. In such an embodiment of the waveguide recourse can be made to previous methods of known art for the manufacture of ohmic circuitry interconnections. However the signal according to the invention is not transported by means of an electron current, which is limited by the drift velocity and scatter processes of the electrons in the metal, but rather by means of the plasmon oscillation of the free electron gas, at the bounding surface, which propagates approximately at the velocity of light.

The gate electrode 13 of the waveguide can lie at the same potential as the gate electrodes of the transmitting and/or receiving MOSFETS 1, 2. In a preferred embodiment, the gate electrode 13 of the waveguide is insulated from those of the MOSFET 8. Thereby the gate capacitance of the transistors is reduced and a more rapid switching characteristic is available.

In another embodiment the metal layer does not comprise a continuous coating, but a partial coating. The partial coating comprises a plurality of sub-areas. Each sub-area has a length and a width of at least 10 nm up to 100 nm. In the extension direction of the waveguide the sub-areas are separated from one another by a gap. The gap has a length that is smaller than the width of an individual sub-area in the lengthwise direction. By means of this embodiment of the waveguide the latter can be produced with very small dimensions and the space requirement on the chip is reduced.

In a further embodiment of the invention, a two-dimensional electron gas in the waveguide is also available by means of a super-lattice and appropriate doping of the semiconductor substrate. A super-lattice is formed by at least one layer of a semiconductor comprising a first band gap covered by at least one layer of a semiconductor comprising a second band gap. By this measure, quantum-wells are formed which may confine a two-dimensional electron gas. The technique of building super-lattices on a semiconductor die are well known to those skilled in the art. To supply charge carriers, the super-lattice is doped by a dopant, such as an element of the $3^{rd}$ or $5^{th}$ group of the periodic system. As an example, the dopant may comprise nitrogen, phosphorus, arsenic, boron, aluminum or gallium. This embodiment is advantageous as the waveguide no longer requires any kind of operating voltage and can be integrated as a passive component within the integrated circuit.

The modulated plasmon waves propagate along the waveguide 3 in the charge carrier inversion layer lying underneath the electrode 13, and thus arrive at the channel region of the receiving MOSFET 2 between drain electrode 7b and source electrode 6b. Depending on the configuration of the waveguide, the plasmon waves experience a loss, which can be reduced down to a few dB/cm. A current is induced as a result of the plasmon wave in the channel region 11b of the second MOSFET 2. By means of the ohmic resistance of the channel region 11b and the rectification by the MOSFET 2 a voltage can be measured between drain electrode 7b and source electrode 6b. This induced voltage represents the electric signal, which corresponds to the signal of the modulated plasmon wave and can be processed further by use of a second semiconductor structure 4 of the integrated circuit.

Figure 2:
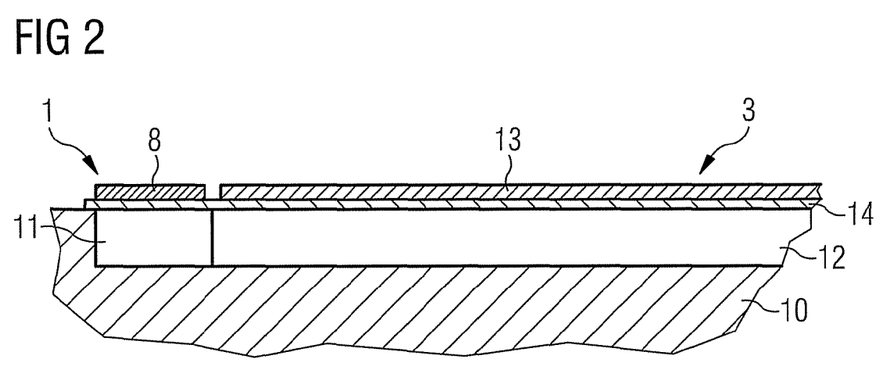
FIG. 2 shows schematically a cross section of a MOSFET cooperating with a waveguide according to one embodiment of the invention.

Reference is made to FIG. 2 showing a cross section of a sending or a receiving MOSFET 1 or 2 and a waveguide 13. The figure shows a channel region 11 of a MOSFET 1, 2. The channel region 11 is covered by an insulator 14 and a gate electrode 8 made from a metal layer. The insulator 14 may comprise an oxide or a nitride compound. If the semiconductor is made from silicon, the insulator may be made of $SiO_x$ and/or SiN. The metal layer preferably contains gold, copper or aluminum.

Adjacent to the channel region 11 is a waveguide region 12. The waveguide region 12 is also delimited by the insulator 14 and a further metal layer 13. To achieve a propagation of the plasmon waves a positive supply voltage is applied to the metal layer 13 to lower the potential energy of the electrons at the boundary layer between the n-type semiconductor 10 and the insulator 14. The amplitude of the voltage is chosen so that the conduction band lowers under the Fermi energy. A triangular-shaped quantum-well develops which restricts the movement of the electrons in the plane of the waveguide. The so-called charge carrier inversion layer bounds a two-dimensional electron gas in which the plasmon wave propagates in a geometrically localized manner.

According to the invention the surface plasmons generated in the channel region 11 of the transmitting MOSFET 1 are coupled into the waveguide region 12 such that the channel of the MOS transistor and a sub-region of the waveguide geometrically overlap. Since the MOS transistor is confined on all sides by gate electrode 8, drain electrode 7, source electrode 6 and the shape of the doping profile of the channel region 11, the plasmon waves propagate in the direction of the waveguide region 12. The receiving MOSFET 2 is interconnected with the waveguide region 12 in an analogous manner.

A particularly good coupling between the transmitting or receiving MOSFET 1, 2 and the waveguide 3 ensues if the eigenfrequencies of the plasmons in the channel region 11 of the at least one MOSFET 1 and in the waveguide region 12 are identical. Thereby a resonance condition for coupling is fulfilled and a low loss transfer of the signal is made possible. The eigenfrequency is determined by the type and concentration of the dopant, the geometric size of the elements and the gate voltage. Needless to say it is familiar to the person skilled in the art that identical doping in the context of the present invention also includes such forms of embodiment in which a small deviation between two regions occurs as a result of diffusion of the doping materials, or differences in implantation depths and quantities, caused by manufacturing conditions. A full alignment between the doping of the waveguide and channel region cannot normally be achieved in the manufacturing process.

Figure 3:
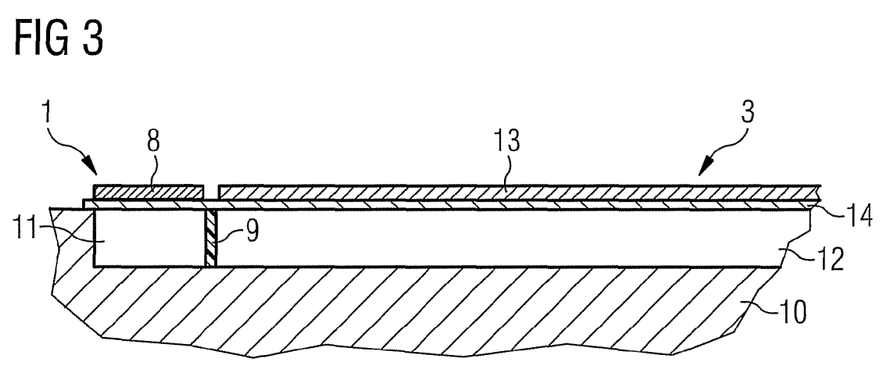
FIG. 3 shows schematically a cross section of a MOSFET cooperating with a waveguide according to another embodiment of the invention.

With respect to FIG. 3 a different embodiment of the invention is explained. The figure shows a cross sectional view on a sending or a receiving MOSFET 1 or 2 and a waveguide 13. The figure shows a channel region 11 of a MOSFET 1, 2. The channel region 11 is covered by an insulator 14 and a gate electrode 8 made from a metal layer. The insulator 14 may comprise an oxide or a nitride compound. If the semiconductor is made from silicon, the insulator may be made of $SiO_x$ and/or SiN. The metal layer preferably contains gold, copper or aluminum.

Adjacent to the channel region 11 is a tunnel barrier 9. The other side of the tunnel barrier 9 is adjacent to the waveguide region 12. The waveguide region 12 is also delimited by the insulator 14 and a further metal layer 13. To achieve a propagation of the plasmon waves a negative supply voltage is applied to the metal layer 13 to lower the potential energy of the electrons at the boundary layer between the p-type semiconductor 10 and the insulator 14. The amplitude of the voltage is chosen so that the conduction band lowers under the Fermi energy. A triangular-shaped quantum-well develops which restricts the movement of the electrons in the plane of the waveguide. The so-called charge carrier inversion layer bounds a two-dimensional electron gas in which the plasmon wave propagates in a geometrically localized manner.

The insulator 14 may or may not cover the area 9 of the tunnel barrier. The barrier 9 itself is made from a doped region or a trench filled with an insulator material. The barrier 9 hinders charge carriers from channel region 11 to be injected into waveguide region 12. Nevertheless, although no galvanic contact is made between channel region 11 and waveguide region 12 some charge carriers may penetrate the barrier 9 by tunneling. As the barrier 9 has only a small width, the electromagnetic coupling of a plasmon wave between the channel region 11 and the waveguide region 12 is still possible.

A ballistic transport is a necessary condition for plasmon excitation in the gate region 11 of a MOSFET 1. The ballistic transport occurs, if the product of the relaxation time τ and the plasmon velocity S is larger than the length L of the channel region 11 of the MOSFET 1. As the relaxation time τ is given by the mobility μ of the charge carriers and the effective mass m* of the charge carriers, the plasmon velocity S can be expressed by the gate voltage as follows:

$$\tau = \frac{\mu \cdot m^*}{e}$$

$$S = \frac{e \cdot U}{m^*}$$

Therefore, ballistic transport is possible if the length L of the channel region 11 is smaller than a critical length $L_{kr}$ which is given by the product of the relaxation time τ and the plasmon velocity S.

The lowest resonance frequency $f_R$ of a plasmon wave inside the channel region 11 of a MOSFET 1 featuring the gate length L is given by $$f_r = \frac{L_{cr}}{4 \cdot L}$$

To allow for a reasonable resonance frequency $f_R$ of a plasmon wave, the gate length L should be below 100 nm for the most common semiconductor materials, such as silicon, germanium, gallium-arsenide or indium-antimonide.

The channel region 11 of MOSFET 1 is a resonance cavity for the plasmon wave. Therefore, a quality factor Q can be assigned. The quality factor Q of a plasmon wave generating channel region 11 of MOSFET 1 is equal to the proportion of the critical length $L_{kr}$ to the actual length L. Therefore, the quality of the plasmon wave becomes better with decreasing length of the channel region 11. For a gate length of 100 nm, the quality factor Q is between 2 and 20 for different semiconductor materials.

Figure 4:
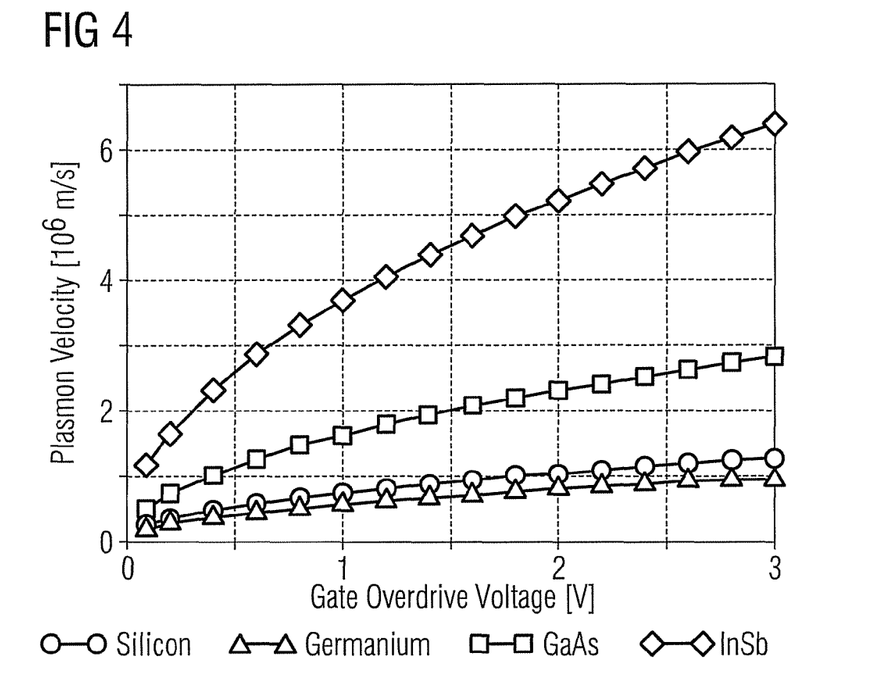
FIG. 4 shows the plasmon velocity of a MOSFET made of different materials and for different gate voltages

FIG. 4 illustrates how the plasmon velocity S depends on the gate overdrive voltage and the semiconductor material. The plasmon velocity S limits the propagation velocity of a signal transferred by a plasmon wave guide. It has to be noted, that the drift velocity of electrons in a conventional silicon device is always below $10^5$ m/s. Compared with this value, the plasmon velocity is at least a factor of 10 higher. Depending on the gate of the overdrive voltage and the semiconductor material used, the plasmon velocity can increase further.

Figure 5:
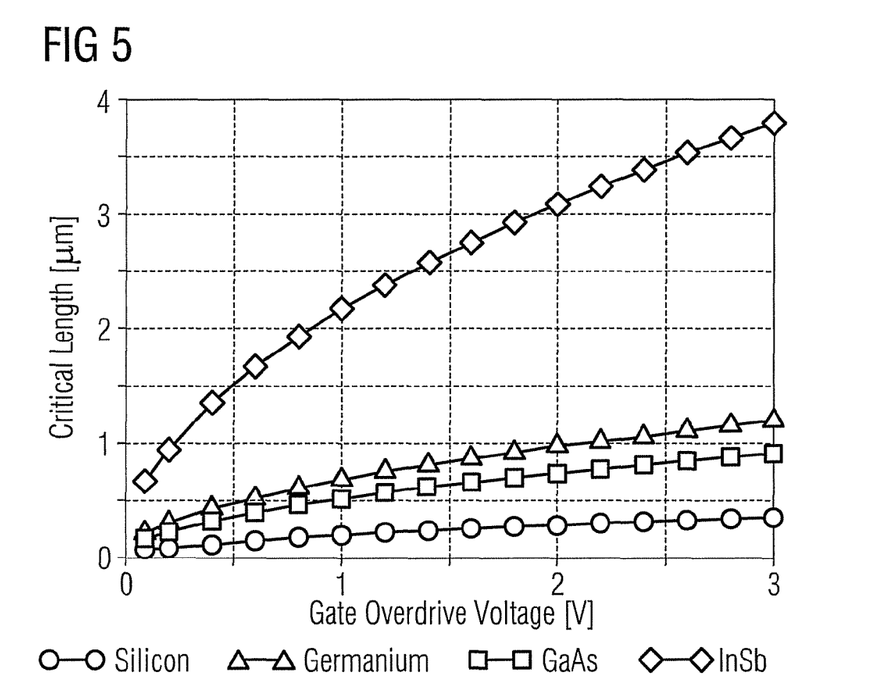
FIG. 5 shows the critical length of a MOSFET made of different materials and for different gate voltages

FIG. 5 shows the critical length $L_{kr}$ of the channel region 11 depending on the gate overdrive voltage and the semiconductor material used. As can be seen from FIG. 5, a critical length $L_{kr}$ of more than 100 nm is given even for the worst case of a silicon MOSFET at a moderate gate overdrive voltage of 1 volt. For an efficient stimulation or detection of plasmon waves by use of a MOSFET, the length L of the channel region 11 should be smaller than the critical length. Therefore, the length of the channel region should be less than 100 nm when silicon is used as semiconductor material. It is well-known to those skilled in the art to build such a MOSFET.

Figure 6:
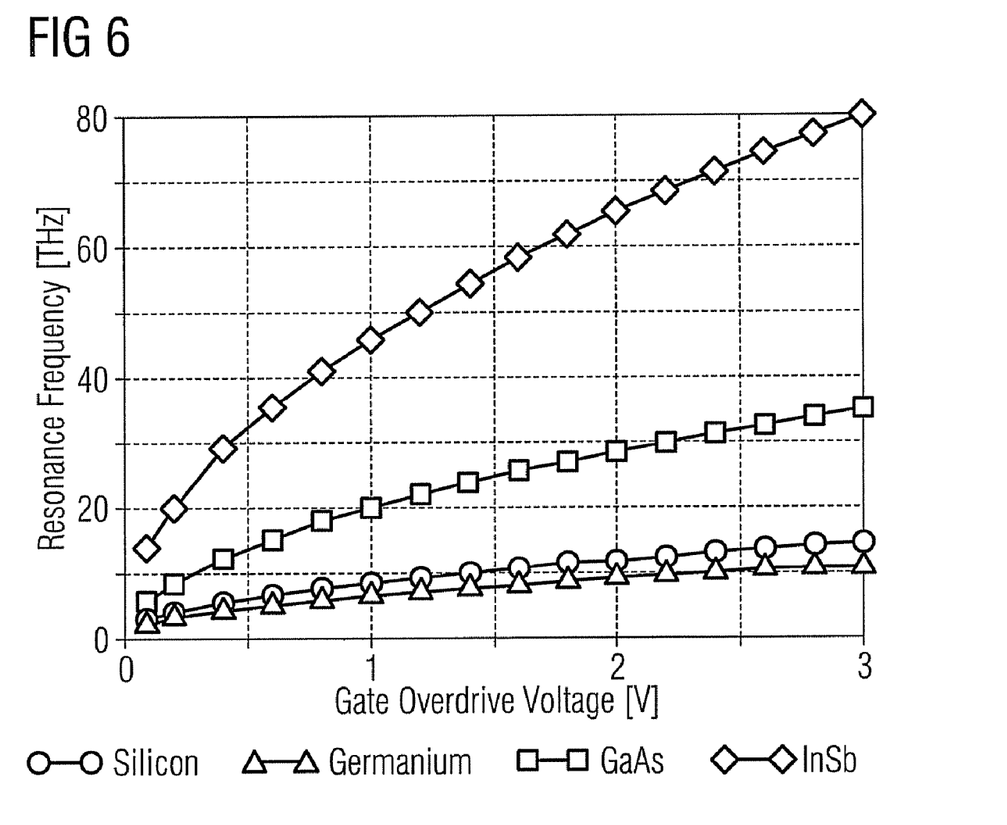
FIG. 6 shows the resonance frequency of a MOSFET depending on the semiconductor material used and the gate voltage applied.

FIG. 6 depicts the dependency of the resonance frequency $f_R$ on the gate overdrive voltage and the semiconductor material used. Values shown in FIG. 6 apply to a MOSFET with a channel region of 20 nm in length. A higher frequency is preferred as it leads to a smaller width of the plasmon wave guide 3. Despite the high resonance frequency, which exceeds the resonance frequencies which are applicable to conventional semiconductor electronics, an attenuation as low as 8 dB/cm has been achieved for a waveguide up to 1 cm in length.

The gate overdrive voltage indicated in FIGS. 4 to 6 is a positive voltage for an n-type semiconductor material used for the wave guide region 12 or the channel region 11. If a p-type semiconductor material is used for the channel region 11 and/or the wave guide region 12, the gate overdrive voltage is chosen as a negative voltage with respect to ground potential. The gate overdrive voltage is the actual gate voltage reduced by the threshold voltage of the MOSFET.

The preceding description describes advantageous exemplary embodiments of the invention only. The features disclosed therein and the claims and the drawings can, therefore, be essential for the realization for the invention in its various embodiments, both individually and in any combination. While the foregoing is directed to embodiments of the present invention, other and further embodiments of the invention may be devised without leaving the basic scope of the invention, this scope being detailed by the following claims.

The invention claimed is:

1. An interconnection network between a first semiconductor structure and a second semiconductor structure, comprising
   a transmitter for transmitting a signal originating from said first semiconductor structure, said transmitter being electrically connected to said first semiconductor structure and being adapted to convert said signal to a modulated plasmon wave,
   a waveguide extending from said first semiconductor structure to said second semiconductor structure and cooperating with said transmitter to receive said modulated plasmon wave, and
   a receiver cooperating with said waveguide to receive said modulated plasmon wave and being adapted to convert it to a modulated electric signal, said receiver being electrically connected to said second semiconductor structure
   wherein any of said transmitter or said receiver comprises at least one MOSFET, said MOSFET comprising a source electrode and a drain electrode adjacent to a channel region which is delimited by an electrically insulated gate electrode and wherein said MOSFET is adapted to generate a plasmon wave in said channel region.

2. Interconnection network according to claim 1, wherein any of said transmitter or said receiver comprise at least one diode.

3. Interconnection network according to claim 1, wherein said channel region of said at least one MOSFET is adapted to allow a ballistic transport of charge carriers.

4. Interconnection network according to claim 1, wherein said waveguide comprises at least any of a boundary layer between a metal layer and a semiconductor, or a boundary layer between a metal layer and an insulator.

5. Interconnection network according to claim 4, wherein said metal layer is embodied as a partial coating, wherein each partial area has a length and a width of at least 10 nm up to 100 nm and each of said partial areas is separated from a subsequent partial area by a gap that has a length which is less than the dimension of said partial area in the direction of said waveguide.

6. Interconnection network according to claim 5, wherein the metal layer of the waveguide has no electrically conductive contact to any part of any of the transmitter or the receiver.

7. Interconnection network according to claim 1, wherein said waveguide has a layer structure comprising at least a metal layer, an insulating layer, and a semiconductor.

8. The interconnection network according to claim 7, wherein said insulating layer comprises an oxide layer.

9. Interconnection network according to claim 1, wherein the waveguide includes a semiconductor region, in which a two-dimensional electron gas can be formed.

10. Interconnection network according to claim 1, wherein any of said receiver or said transmitter are adapted to cooperate with said waveguide by forming a geometrical overlap between an end of said waveguide and a sub-region of any of said transmitter or said receiver.

11. Interconnection network according to claim 1, wherein any of said receiver or said transmitter are adapted to cooperate with said waveguide by abutting to a first side of a tunnel barrier and a second side of a tunnel barrier respectively.

12. Interconnection network according to claim 1, wherein any of said receiver or said transmitter are adapted to cooperate with said waveguide by an electromagnetic coupling.

13. Interconnection network according to claim 1, which is monolithically arranged on a silicon die together with said first semiconductor structure and said second semiconductor structure.

14. An interconnection network between a first semiconductor structure and a second semiconductor structure, comprising
   at least one MOSFET for transmitting a signal originating from said first semiconductor structure, said MOSFET comprising a source electrode and a drain electrode adjacent to a channel region which is delimited by an electrically insulated gate electrode, said MOSFET being electrically connected to said first semiconductor structure and wherein said MOSFET is adapted to generate a modulated plasmon wave in said channel region,
   a waveguide extending from said first semiconductor structure to said second semiconductor structure and cooperating with said MOSFET to receive said modulated plasmon wave, said waveguide comprising at least any of a boundary layer between a metal layer and a semiconductor, or a boundary layer between a metal layer and an insulator,
   at least one MOSFET for receiving a signal originating from said waveguide, said MOSFET comprising a source electrode and a drain electrode adjacent to a channel region which is delimited by an electrically insulated gate electrode, said MOSFET being electrically connected to said second semiconductor structure and wherein said MOSFET cooperates with said waveguide to receive a modulated plasmon wave in said channel region and being adapted to convert it to a modulated electric signal.

15. Interconnection network according to claim 14, wherein the concentration of a doping element of a semiconductor material in the region of said waveguide corresponds to the concentration of a doping element in said channel region of said at least one MOS transistor.

16. Interconnection network according to claim 14, wherein said channel region of said at least one MOSFET is adapted to allow a ballistic transport of charge carriers.

17. Interconnection network according to claim 14, wherein said metal layer is embodied as a partial coating, wherein each partial area has a length and a width of at least 10 nm up to 100 nm and each of said partial area is separated by a subsequent partial area by a gap that has a length which is less than the dimension of said partial area in the direction of said waveguide.

18. Interconnection network according to claim 14, wherein said MOSFET are cooperating with said waveguide by forming a geometrical overlap between an end of said waveguide and at least a sub-region of said channel region of said MOSFET.

19. Interconnection network according to claim 14, wherein said MOSFET are cooperating with said waveguide by abutting to a first side of a tunnel barrier and a second side of a tunnel barrier respectively.

20. Interconnection network according to claim 14, wherein said MOSFET are cooperating with said waveguide by an electromagnetic coupling.

21. An integrated circuit, comprising
a first semiconductor structure,
a second semiconductor structure,
a transmitter for transmitting a signal originating from said first semiconductor structure, being electrically connected to said first semiconductor structure and being adapted to convert said signal to a modulated plasmon wave,
a waveguide extending from said first semiconductor structure to said second semiconductor structure and cooperating with said transmitter to receive said modulated plasmon wave, said waveguide comprising at least any of a boundary layer between a metal layer and a semiconductor, or a boundary layer between a metal layer and an insulator, and
a receiver cooperating with said waveguide to receive said modulated plasmon wave and being adapted to convert it to a modulated electric signal, said receiver being electrically connected to said second semiconductor structure
wherein any of said transmitter or said receiver comprises at least one MOSFET, said MOSFET comprising a source electrode and a drain electrode adjacent to a channel region which is delimited by an electrically insulated gate electrode and wherein said MOSFET is adapted to generate a plasmon wave in said channel region.

22. Integrated circuit according to claim 21, wherein any of said transmitter or said receiver comprises at least one diode.

23. Integrated circuit according to claim 21, wherein said channel region of said at least one MOSFET is adapted to allow a ballistic transport of charge carriers.

24. Integrated circuit according to claim 21, wherein the metal layer of the waveguide has no electrically conductive contact to any part of any of the transmitter or the receiver.

25. Integrated circuit according to claim 21, wherein the waveguide includes a semiconductor region, in which a two-dimensional electron gas can be formed.

26. Integrated circuit according to claim 21, wherein any of said receiver or said transmitter are cooperating with said waveguide by forming a geometrical overlap between an end of said waveguide and a sub-region of any of said transmitter or said receiver.

27. Integrated circuit according to claim 21, wherein any of said receiver or said transmitter are cooperating with said waveguide by abutting to a first side of a tunnel barrier and a second side of a tunnel barrier respectively.

28. Integrated circuit according to claim 21, wherein the any of said receiver or said transmitter are cooperating with said waveguide by an electromagnetic coupling.

29. A method for signal transfer between a first semiconductor structure and a second semiconductor structure, said method comprising the following steps:
generating an electric signal by use of said first semiconductor structure,
transmitting said electric signal to a transmitter for transmitting said signal,
converting said electric signal to a modulated plasmon wave by use of said transmitter,
coupling said modulated plasmon wave to a first end of a waveguide cooperating with said transmitter,
coupling said modulated plasmon wave from a second end of said waveguide to a receiver cooperating with said waveguide,
converting said modulated plasmon wave to an electric signal by use of said receiver, and
transmitting said electric signal to said second semiconductor structure
wherein any of said transmitter or said receiver comprises at least one MOSFET, said MOSFET comprising a source electrode and a drain electrode adjacent to a channel region which is delimited by an electrically insulated gate electrode and wherein said modulated plasmon wave is generated in said channel region.

30. The method according to claim 29, wherein a two-dimensional electron gas is formed in any of the waveguide or the receiver or the transmitter.

31. The method according to claim 29, wherein any of said transmitter or said receiver comprises at least one diode and wherein said modulated plasmon wave is generated in said diode.

32. The method according to claim 29, wherein at least one MOSFET is provided to act as said transmitter, wherein said transmitter cooperates with said waveguide by forming a geometrical overlap between an end of said waveguide and at least a sub-region of said channel region of said MOSFET, and wherein a ballistic transport of charge carriers is induced between said source contact and said drain contact of said MOSFET.

33. The method according to claim 29, wherein an inversion layer is formed in said channel region of said MOSFET.

34. The method according to claim 29, wherein at least one MOSFET is provided to act as said receiver, wherein said receiver cooperates with said waveguide by forming a geometrical overlap between an end of said waveguide and at least a sub-region of said channel region of said MOSFET, and wherein a modulated plasmon wave is induced between said source contact and said drain contact of said MOSFET, leading to a voltage between said source contact and said drain contact.

35. The method according to claim 29, wherein the eigenfrequency of said plasmon wave in the channel region of said at least one MOSFET and the eigenfrequency of said plasmon wave in said waveguide are identical.

36. A method of manufacturing an integrated circuit, said method comprising the following steps:
providing a first semiconductor structure,
providing a second semiconductor structure,
providing a transmitter for transmitting a signal originating from said first semiconductor structure, being electrically connected to said first semiconductor structure and being adapted to convert said signal to a modulated plasmon wave, providing a waveguide extending from said first semiconductor structure to said second semiconductor structure and cooperating with said transmitter to receive said modulated plasmon wave, said waveguide comprising at least any of a boundary layer between a metal layer and a semiconductor, or a boundary layer between a metal layer and an insulator, and providing a receiver cooperating with said waveguide to receive said modulated plasmon wave and being adapted to convert it to a modulated electric signal, said receiver being electrically connected to said second semiconductor structure, wherein any of said transmitter or said receiver is provided by forming at least one MOSFET, said MOSFET comprising a source electrode and a drain electrode adjacent to a channel region which is delimited by an electrically insulated gate electrode and wherein said MOSFET is adapted to generate a plasmon wave in said channel region.

37. The method according to claim 36, wherein any of said transmitter or said receiver is provided by forming at least one diode.

38. The method according to claim 36, wherein said waveguide is provided by forming at least any of a boundary layer between a metal layer and a semiconductor, or a boundary layer between a metal layer and an insulator.

39. The method according to claim 38, wherein the metal layer of the waveguide has no electrically conductive contact to any part of any of the transmitter or the receiver.

40. The method according to claim 36, wherein any of said receiver or said transmitter are adapted to cooperate with said waveguide by forming a geometrical overlap between an end of said waveguide and a sub-region of any of said transmitter or said receiver.

41. The method according to claim 36, wherein any of said receiver or said transmitter are adapted to cooperate with said waveguide by abutting to a first side of a tunnel barrier and a second side of a tunnel barrier respectively.

42. The method according to claim 36, wherein the any of said receiver or said transmitter are adapted to cooperate with said waveguide by an electromagnetic coupling.

* * * * *